United States Patent [19]
Yamazaki et al.

[11] Patent Number: 5,557,128
[45] Date of Patent: Sep. 17, 1996

[54] INSULATED-GATE TYPE BIPOLAR TRANSISTOR

[75] Inventors: Tomoyuki Yamazaki; Shigeyuki Obinata, both of Nagano, Japan

[73] Assignee: Fuji Electric Co., Ltd., Tokyo, Japan

[21] Appl. No.: 397,417

[22] Filed: Mar. 1, 1995

[30] Foreign Application Priority Data

Mar. 4, 1994 [JP] Japan .................... 6-033985

[51] Int. Cl.$^6$ ................................. H01L 29/76
[52] U.S. Cl. ................ 257/341; 257/355; 257/378
[58] Field of Search ................. 257/341, 355, 257/378, 506

[56] References Cited

U.S. PATENT DOCUMENTS

| | | | |
|---|---|---|---|
| 4,136,354 | 1/1979 | Dobkin | 357/36 |
| 4,688,065 | 8/1987 | Kinoshita et al. | 357/23.13 |
| 4,783,690 | 11/1988 | Walden et al. | 357/23 |
| 5,045,900 | 9/1991 | Tamagawa | 357/23.4 |
| 5,097,302 | 3/1992 | Fujihira et al. | 357/23 |
| 5,303,110 | 4/1994 | Kumagai | 361/18 |
| 5,341,003 | 8/1994 | Obinata | 257/341 |

FOREIGN PATENT DOCUMENTS

| | | |
|---|---|---|
| 0109070 | 5/1984 | European Pat. Off. . |
| 0314465 | 5/1989 | European Pat. Off. . |
| 4209148 | 10/1992 | Germany . |
| 4-5864 | 1/1992 | Japan . |
| 5-95118 | 4/1993 | Japan . |

*Primary Examiner*—Mark V. Prenty
*Attorney, Agent, or Firm*—Brumbaugh, Graves, Donohue & Raymond

[57] ABSTRACT

For stabilized overcurrent protection, an insulated-gate type bipolar transistor (IGBT) is provided with an overcurrent limiting feature having reduced dependence of the limited-current value on the power supply voltage. Sensing cells 9 for current detection are formed on part of a semiconductor substrate 5 on which a large number of IGBT main cells 6 are formed integratedly. Emitter electrodes 10 of the sensing cells are connected to an external overcurrent-protection circuit for current detection and overcurrent protection. The sensing cells and the main cells are electrically separated. P-wells 11 for drawing out hole current, connected to the emitter electrodes of the main cells, are formed in a region along the circumference of the sensing cells so that interference between the carriers of the main cells and those of the sensing cells is suppressed and current ratio is stabilized.

4 Claims, 3 Drawing Sheets

INSULATED-GATE TYPE BIPOLAR TRANSISTOR

BACKGROUND OF THE INVENTION

The present invention relates to semiconductor devices and, more particularly, to insulated-gate type bipolar transistors (IGBT) acting as power-switching devices.

An insulated-gate type bipolar transistor (hereinafter referred to as IGBT) is a voltage-driven semiconductor switching device capable of high-speed turn-off at a relatively low applied voltage. IGBT's are used widely in the power-electronics field, e.g., in inverters and the like.

An IGBT-output type inverter device may have an overcurrent flow into the IGBT if there is an inrush current when a motor is activated, and failures such as a load short circuit and arm short circuit may occur. Hence, superior electric characteristics are required for protecting the IGBT against high voltage and large current, including a breakdown withstand capability known as a short-circuit withstand capability.

Inverter devices usually include a protection circuit to detect the occurrence of short-circuit failures and to turn the power supply off. This protection circuit requires 10 to 20 μsec to detect the overcurrent and effect its protective function. The IGBT must be protected against breakdown during this time.

Many recent high-performance IGBT modules adopt an overcurrent-protection system which is disposed independently of the protection circuit in the inverter device. Such an overcurrent-protection system can quickly detect an overcurrent flowing into the IGBT when a short-circuit failure occurs, can limit the current in the IGBT, and can suppress it to within the short-circuit withstand capability of the elements by means of a gate control based on this overcurrent detection signal before the power supply is turned off by the protection circuit.

FIG. 5 shows an IGBT overcurrent-protection circuit according to this protection system. Connected in parallel with main element 1 (IGBT) is a current-detection sub-element 2 (IGBT further to the main element 1). The sub-element 2 is also connected in series with a current-detection resistance 3. A switching element 4 (MOSFET) is connected to the gate-driving circuits for the main element 1 and the sub-element 2 to perform on-off operation according to the voltage generated between the ends of the current-detection resistance 3.

When an overcurrent due to load short-circuit failure or the like flows into the main element 1 and the sub-element 2 and causes the voltage between the ends of the current-detection resistance 3 to exceed the threshold voltage of the switching element 4, the switching element 4 turns on to reduce the gate voltage of both the main element 1 and the current-detection sub-element 2, thus limiting the main current flowing in the main element 1. Thus, the main current can be lowered to within the short-circuit withstand capability of the element 1 by means of suitably setting the resistance of the current-detection resistance 3 and the threshold voltage of the switching element 4.

If an overcurrent-protection circuit having a sub-element 2 for current detection is constructed as an external, independent circuit, it is difficult to maintain the operational characteristics of the main element 1 proportional to those of the sub-element 2 because of the temperature rise of the chip. Moreover, since there are different modes of short-circuit phenomena in an inverter, e.g., arm short circuit, series short circuit, output short circuit and ground fault, and since the collector-to-emitter voltage $V_{CE}$ applied to the IGBT element to be protected may depend on the mode, the current ratio between the main element 1 and the sub-element 2 may vary. Correspondingly, the limited-current value may vary also, if the collector-to-emitter voltage $V_{CE}$ varies when the operational characteristics of the main element 1 and the sub-element 2 differ as described above. Therefore, it is difficult to realize a stable overcurrent-protection operation.

To solve the above problem, a configuration has been described by the present applicant in Japanese Patent Document No. 5-256197, wherein some of the IGBT cells formed integratedly on a semiconductor substrate are used as sensing cells to detect the current. The emitter electrodes of the sensing cells are separated from the emitter electrodes of the main cells formed on the same substrate, and are connected to a current-detection resistance in an overcurrent-protection circuit.

SUMMARY OF THE INVENTION

It was found that, depending on the position of the sensing cells on the semiconductor substrate, there may occur mutual interference between carriers in the boundary region of a main cell and a sensing cell, causing the ratio of the main current flowing in the main cell to the current flowing in the sensing cell to vary. It was found further that, in IGBT elements, a difference in current density due to gate potential difference can arise between the sensing cell with its emitter potential raised due to the current-detection resistance in the overcurrent-protection circuit, and the main cell with its emitter at ground potential. As a result, the limited-current value of the main current at overcurrent protection may vary as the collector-to-emitter voltage $V_{CE}$ changes, and the limited-current values tend to increase in a low voltage region where the collector-to-emitter voltage $V_{CE}$ is low. If the voltage dependence of the limited-current values increases, there may be impairment of the overcurrent-protection functions if the IGBT is applied to an inverter device, so that it is desirable to minimize the voltage dependence of the limited-current values.

It is an object of the present invention to provide an IGBT with an overcurrent-limiting function that is capable of maintaining the ratio of the main current to the detection current constant even in different operating environments, while suppressing the voltage dependence of the limited-current values.

This object can be achieved by the present invention, i.e., an IGBT with sensing cells for current detection formed in part of a semiconductor substrate, in which a plurality of main cells are integratedly formed. The emitter electrodes of the sensing cells are separated from the emitter electrodes of the main cells and are connected to an overcurrent-protection circuit. The sensing cells are electrically separated from the main cells.

The following features are preferred:

(i) The distance between the sensing cells and the main cells adjoining the sensing cells is greater than the electron diffusion length or, specifically, 100 μm or more.

(ii) P-wells for drawing out hole current, connected to emitter electrodes of the main cells, are formed in a region along the circumference of the sensing cells.

(iii) A separation region is formed between the sensing cells and the main cells adjoining the sensing cells.

DETAILED DESCRIPTION OF PREFERRED EMBODIMENTS

In the above-described configuration, the current flowing into the IGBT is detected by the current-detection resistance in the overcurrent-protection circuit connected to the emitter electrodes via the sensing cells for current detection formed on the same substrate as for the main cells. If an overcurrent flows, e.g., due to load short circuit, the main current is limited by operation of the protection circuit to within the short-circuit withstand capability of the IGBT to protect cells from breaking down. Current interference between the main cells and the sensing cells is suppressed, the current ratio between the main cells and the sensing cells is maintained constant, and the voltage dependence of the limited-current value due to the change in current ratio is suppressed, by laying out the sensing cells on the semiconductor substrate so that they are electrically separated from the main cells. The sensing cells may be at a distance from the main cells as not affected by the current, or a separation feature may be included, e.g., a trench or a dielectric region between the sensing cells and main cells.

Additionally, carrier interference in the boundary region between the main cells and the sensing cells can be minimized by forming P-wells to draw out the hole current, the P-wells being connected to the emitter electrodes of the main cells in a region along the circumference of the sensing cells.

In this manner, by forming the sensing cells for current detection on part of a semiconductor substrate with a large number of main cells that are formed integratedly, and by laying out the sensing cells electrically separated from the main cells, the present invention allows an overcurrent flowing in the IGBT via the sensing cells to be detected with high accuracy, while the current ratio of the main cells to the sensing cells is maintained constant. As a benefit, dependence of the limited-current value on the power supply voltage is minimized, for stable overcurrent protection.

Figure 1A:
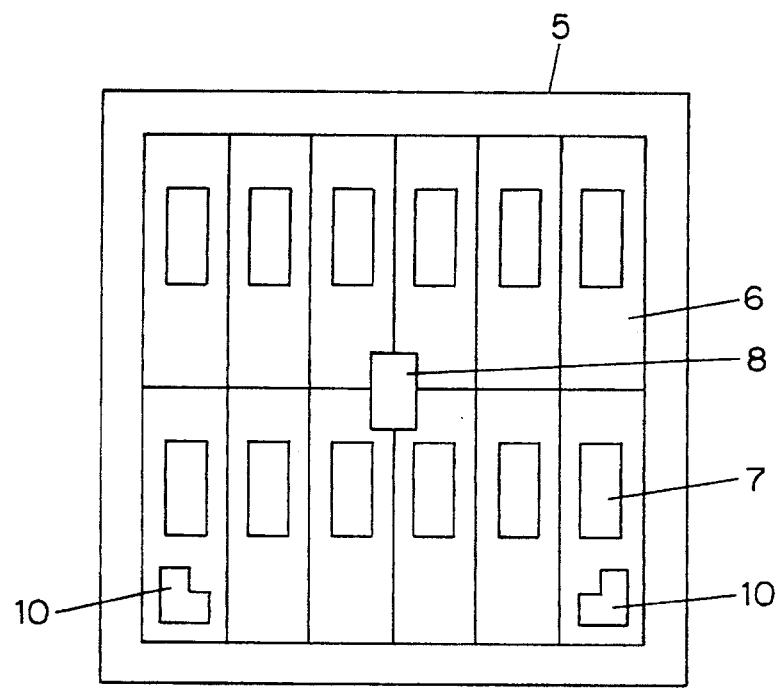
FIGS. 1(a) and 1(b) illustrate the configuration of an IGBT according to a preferred embodiment of the present invention, FIG. 1(a) being a plan view of a chip, and FIG. 1(b) being a cross-sectional view of an IGBT formed in the chip.
Figure 1B:
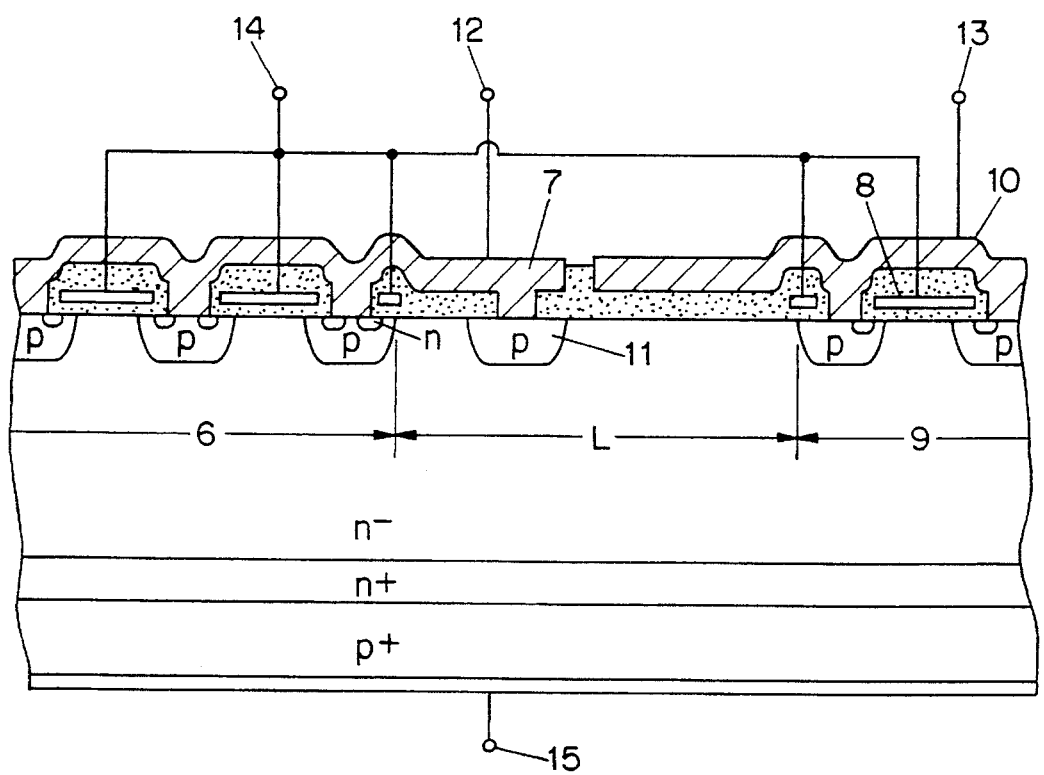
Figure 2:
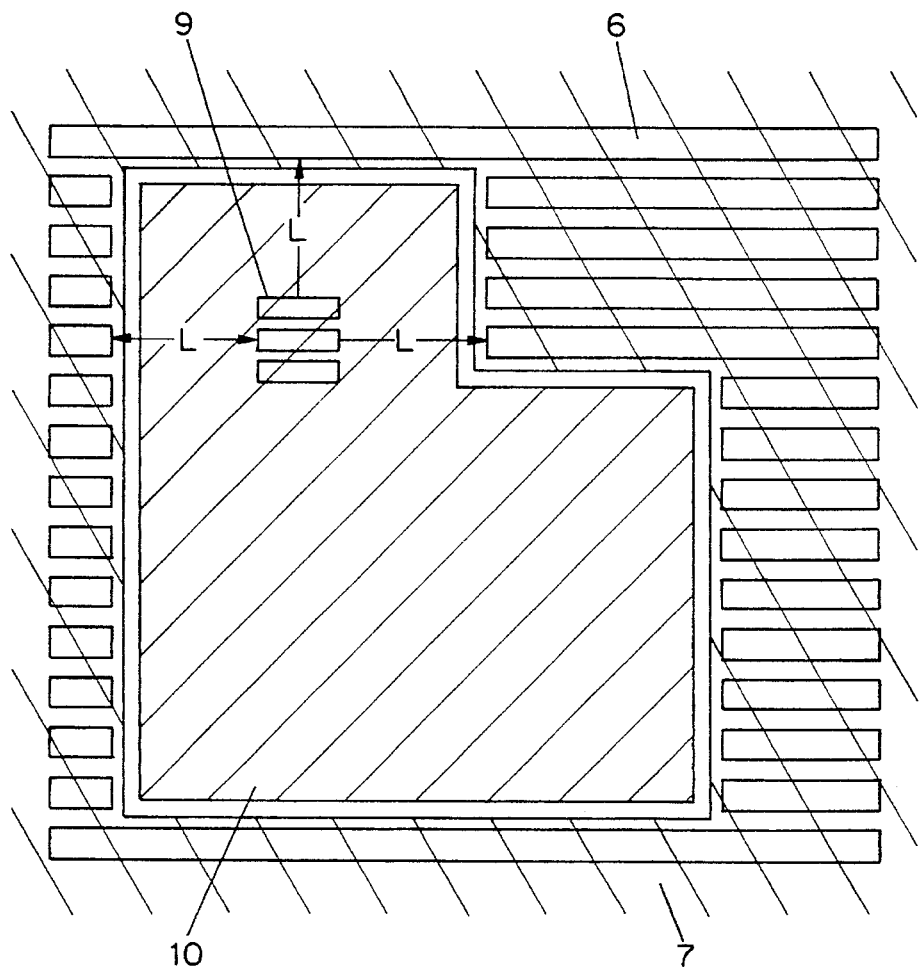
FIG. 2 is an enlarged plan view of a sensing cell in the chip.

In FIGS. 1 and 2, the semiconductor substrate 5 has a large number of n-channel type IGBT main cells 6 in parallel rows. Main emitter electrodes 7 and gate electrodes 8 are formed for the IGBT's of the main cells 6. IGBT's of the same type are formed on a portion of the semiconductor substrate for the sensing cells 9, with emitter electrodes 10 for current detection formed separately and independently from the emitter electrodes 7. P-wells 11 for drawing out the hole current are formed in a region along the circumference of the sensing cells 9 so as to surround the cells. The P-wells are connected to the emitter electrodes 7 of the main cells 6.

In this configuration, the sensing cells 9 are laid out on the semiconductor substrate 5 so as to ensure a distance L of at least 100 μm between the sensing cells 9 and the main cells 6 adjoining the sensing cells, in consideration of the electron diffusion length of the electrons injected from the emitter side. For example, the distance L preferably may be about 200 μm where the semiconductor substrate 5 has a resistivity of 80 Ωcm and an n⁻ drift layer thickness of 80 μm, and uses a power supply voltage of 400 V.

In FIG. 1(b), part 12 is a main emitter terminal, 13 a current-detection emitter terminal, 14 a gate terminal, and 15 a collector terminal. The overcurrent-protection circuit for the main cells is constructed with the current-detection emitter terminal 13 connected to the current-detection resistance 3 shown in FIG. 5. The current-detection resistance 3 and the sub-switching elements 5 may be constructed as an external circuit separate from the IGBT's, or formed around the gate electrode on the semiconductor substrate 5.

Figure 5:
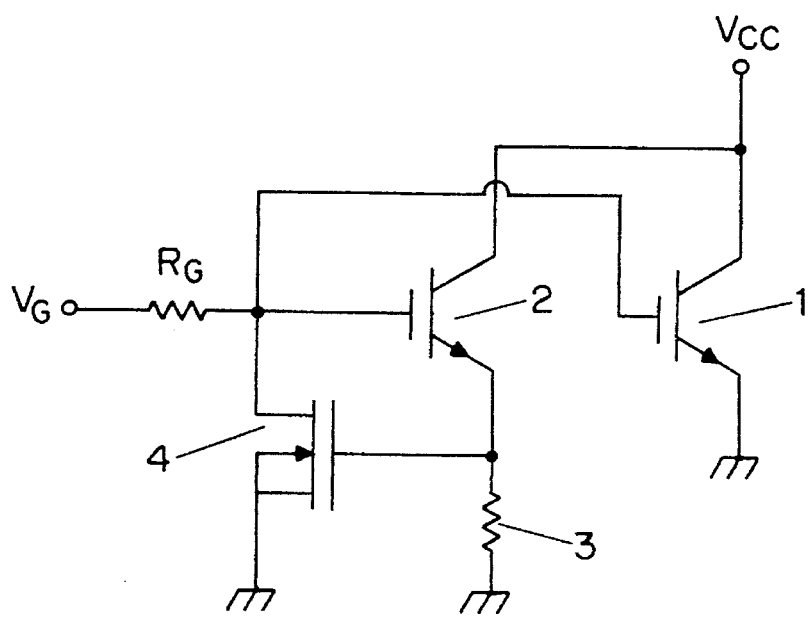
FIG. 5 is a schematic diagram of an overcurrent-protection circuit in an IGBT.

The overcurrent-protection operation of the IGBT according to the above construction is similar to what is illustrated by FIG. 5, and further with carrier interference substantially eliminated in the boundary region between the main cells and the sensing cells, by setting the separating distance L at 100 μm or more between the main cells 6 and the sensing cells 9, and by forming the P-wells 11 for drawing out the hole current on the side of the main cells 6 so that the P-wells surround the area of the sensing cells 9. This construction serves to maintain the current ratio constant between the main current and the detected current, and to keep the limited-current value of the main current nearly constant within the short-circuit withstand capability, when overcurrent limitation is performed in case of a load short circuit, without being affected by the change in the collector-to-emitter voltage.

Alternatively or in combination with distancing, it is also feasible to electrically separate the sensing cells 9 from the main cells 6 by forming a separation region or feature, such as a trench separation or a dielectric separation between the sensing cells 9 and the main cells 6, as shown in the illustrated embodiment. This permits closer spacing between the sensing cells 9 and the main cells 6.

Figure 3:
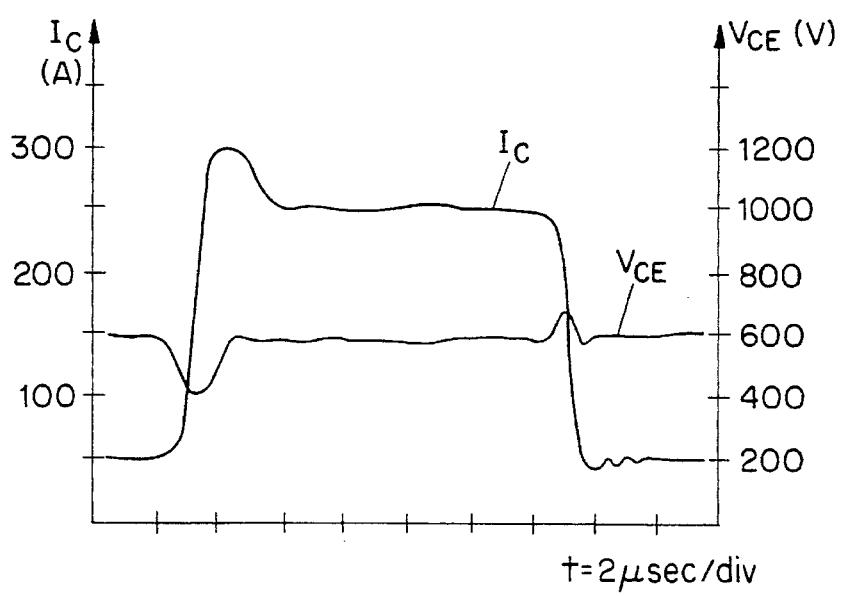
FIG. 3 is a voltage and current waveform diagram observed in a load short-circuit test performed by connecting a protection circuit to the IGBT.

FIG. 3 shows the main current $I_C$ and the voltage $V_{CE}$ observed in a short-circuit test using the overcurrent-circuit connected to the IGBT with the above configuration (with a withstand voltage of 600 V and a rated current of 100 A) and using a power supply voltage of 400 V. FIG. 3 shows that the main current in the IGBT is reduced in a period of a few microseconds, so that the limited-current value relative to the rated current of 100 A is within the short-circuit withstand capability of 250 A.

Figure 4:
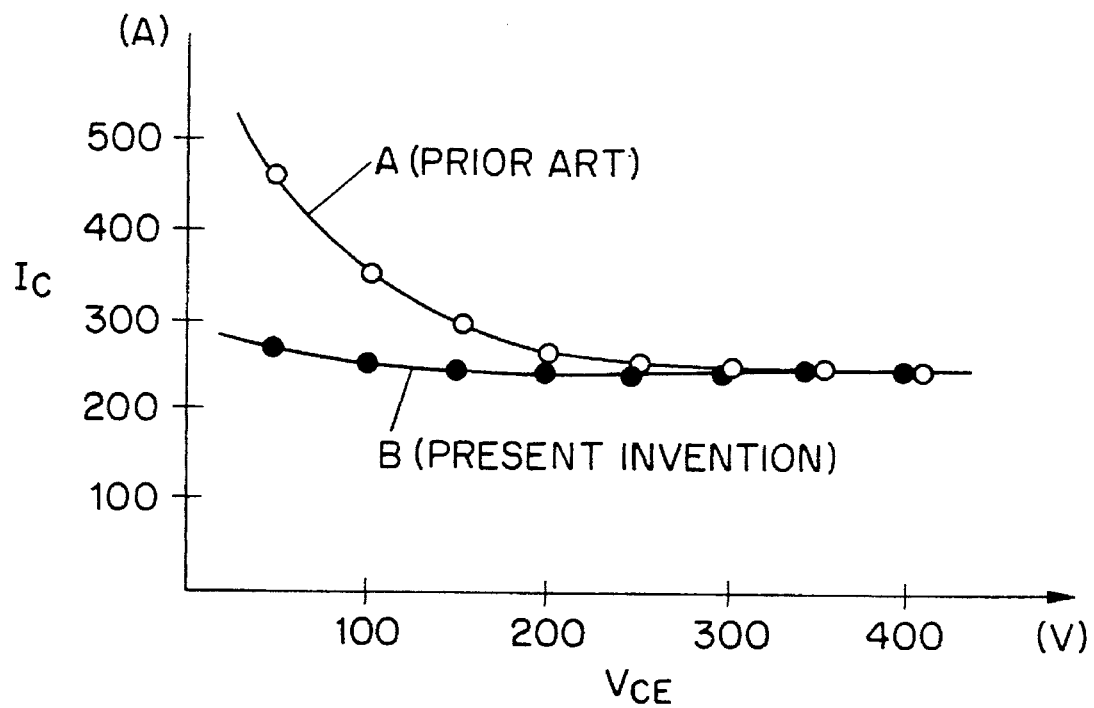
FIG. 4 is a graph illustrating the relationship between the power supply voltage and the limited-current value, for an embodiment of the present invention as compared with the prior art.

FIG. 4 illustrates the limited-current values of an overcurrent when the power supply voltage applied across the collector and the emitter changes. Comparison is between the embodiment described above and a prior-art system with the distance between the sensing cells and main cells as close as 20 μm or less. The prior-art device has an increasing limited-current value in a low voltage region as shown by line "A". Advantageously, in a preferred device of the invention, the limited-current value remains essentially constant from a high voltage region to a low voltage region as shown by line "B". Overcurrent protection is stabilized when the IGBT is used in an inverter device, regardless of the short-circuit mode that may occur.

We claim:

1. An insulated-gate type bipolar transistor comprising:
   a plurality of main cells formed integratedly on a semiconductor substrate, the main cells having emitter electrodes; and
   a plurality of sensing cells formed on the semiconductor substrate and adjoining at least one of the main cells, the sensing cells having emitter electrodes separated from the emitter electrodes of the main cells and connected to an overcurrent protection circuit;
   P-wells connected to the emitter electrodes of the main cells, the P-wells being formed in a region around the sensing cells;
   wherein the sensing cells are separated from the adjoining main cells by a distance greater than about 100 μm.

2. The insulated-gate type bipolar transistor of claim 1, further comprising a separation feature formed between the sensing cells and the adjoining main cells.

3. The insulated-gate type bipolar transistor of claim 2, wherein the separation feature comprises a trench.

4. The insulated-gate type bipolar transistor of claim 2, wherein the separation feature comprises a dielectric region.

* * * * *

UNITED STATES PATENT AND TRADEMARK OFFICE
CERTIFICATE OF CORRECTION

PATENT NO. : 5,557,128
DATED : September 17, 1996
INVENTOR(S) : Yamazaki et al.

It is certified that error appears in the above-indentified patent and that said Letters Patent is hereby corrected as shown below:

On the Title page, at item [56] please insert in column 2,
--OTHER PUBLICATIONS
Patent Abstracts of Japan, Vol. 018, No. 035 (19-1-94) for JP 05 267675 (15-10-93)--.

Signed and Sealed this

Eighteenth Day of February, 1997

Attest:

BRUCE LEHMAN

*Attesting Officer*   *Commissioner of Patents and Trademarks*